(12) United States Patent
Chhatre et al.

(10) Patent No.: US 10,804,081 B2
(45) Date of Patent: Oct. 13, 2020

(54) EDGE RING DIMENSIONED TO EXTEND LIFETIME OF ELASTOMER SEAL IN A PLASMA PROCESSING CHAMBER

(71) Applicant: Lam Research Corporation, Fremont, CA (US)

(72) Inventors: Ambarish Chhatre, Danville, CA (US); David Schaefer, Fremont, CA (US); Keith Gaff, Fremont, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1182 days.

(21) Appl. No.: 14/136,953

(22) Filed: Dec. 20, 2013

(65) Prior Publication Data
US 2015/0179412 A1    Jun. 25, 2015

(51) Int. Cl.
*H01J 37/32*  (2006.01)
*H01L 21/3065*  (2006.01)

(52) U.S. Cl.
CPC .. *H01J 37/32642* (2013.01); *H01J 37/32477* (2013.01); *H01J 37/32715* (2013.01)

(58) Field of Classification Search
CPC ............. H01J 37/32642; H01J 37/32715
USPC .......................................................... 118/728
See application file for complete search history.

(56) References Cited

U.S. PATENT DOCUMENTS

| | | |
|---|---|---|
| 5,534,110 A | 7/1996 | Lenz et al. |
| 5,740,009 A | 4/1998 | Pu et al. |
| 5,800,686 A | 9/1998 | Littau et al. |
| 5,805,408 A | 9/1998 | Maraschin et al. |
| 5,824,605 A | 10/1998 | Chen et al. |
| 5,948,704 A | 9/1999 | Benjamin et al. |
| 5,998,932 A | 12/1999 | Lenz |
| 6,013,155 A | 1/2000 | McMillin et al. |
| 6,013,984 A | 1/2000 | Ellinger et al. |
| 6,039,836 A | 3/2000 | Dhindsa et al. |
| 6,231,674 B1 | 5/2001 | Chen et al. |
| 6,300,651 B1 | 10/2001 | Kato |
| 6,333,272 B1 | 12/2001 | McMillin et al. |
| 6,383,931 B1 | 5/2002 | Flanner et al. |
| 6,489,249 B1 | 12/2002 | Mathad et al. |
| 6,824,627 B2 | 11/2004 | Dhindsa et al. |
| 7,208,326 B2 | 4/2007 | Rennie et al. |
| 7,578,945 B2 | 8/2009 | Vahedi et al. |
| 7,854,820 B2 | 12/2010 | De La Llera et al. |
| 7,862,682 B2 | 1/2011 | Stevenson et al. |
| 7,884,925 B2 | 2/2011 | Howard et al. |

(Continued)

*Primary Examiner* — Parviz Hassanzadeh
*Assistant Examiner* — Nathan K Ford

(57) ABSTRACT

An edge ring configured to surround an outer periphery of a substrate support in a plasma processing chamber wherein plasma is generated and used to process a substrate is disclosed, the substrate support comprising a base plate, a top plate, an elastomer seal assembly between the base plate and the top plate, and an elastomer seal configured to surround the elastomer seal assembly. The edge ring includes an upper inner surface having an edge step directed towards an interior portion of the edge ring and arranged to extend from an outer periphery of a top surface of the top plate to an outer periphery of an upper surface of the base plate, a lower inner surface, an outer surface, a lower surface extending from the lower inner surface to the outer surface, and a top surface extending from the outer surface to the upper inner surface.

30 Claims, 6 Drawing Sheets

(56) References Cited

U.S. PATENT DOCUMENTS

| | | |
|---|---|---|
| 7,952,694 B2 | 5/2011 | Howard et al. |
| 8,038,796 B2 | 10/2011 | Ricci et al. |
| 8,454,027 B2 | 6/2013 | Povolny et al. |
| 8,469,368 B2 | 6/2013 | Kenworthy et al. |
| 2005/0056622 A1 | 3/2005 | Steger |
| 2008/0072823 A1* | 3/2008 | Yudovsky ........... C23C 16/4585 |
| | | 118/728 |
| 2009/0186487 A1 | 7/2009 | Chang et al. |
| 2009/0200269 A1* | 8/2009 | Kadkhodayan ....... C23C 14/564 |
| | | 216/71 |
| 2010/0040768 A1 | 2/2010 | Dhindsa |
| 2010/0078899 A1 | 4/2010 | Povolny et al. |
| 2010/0108261 A1* | 5/2010 | Augustino .............. H01J 37/20 |
| | | 156/345.1 |
| 2011/0004884 A1 | 1/2011 | Merchant et al. |
| 2011/0126984 A1 | 6/2011 | Kang et al. |
| 2013/0097840 A1* | 4/2013 | Schaefer ........... H01L 21/68757 |
| | | 29/428 |

\* cited by examiner

EDGE RING DIMENSIONED TO EXTEND LIFETIME OF ELASTOMER SEAL IN A PLASMA PROCESSING CHAMBER

BACKGROUND

Plasma processing apparatuses are used to process semiconductor substrates by techniques including etching, physical vapor deposition (PVD), chemical vapor deposition (CVD), and resist removal. One type of plasma processing apparatus used in plasma processing includes a reaction chamber containing top and bottom electrodes. A radio frequency (RF) power is applied between the electrodes to excite a process gas into a plasma for processing semiconductor substrates in the reaction chamber. The plasma may contain ions, free radicals, and neutral species with high kinetic energies. By adjusting the electrical potential of the substrate, charged species in the plasma can be directed to impinge upon the surface of the substrate and thereby remove material (e.g., atoms) therefrom.

During etching, the substrate is supported on a substrate support surface within the chamber. Substrate supports can include edge rings positioned around the substrate support (e.g., around the substrate) for confining plasma to the volume above the substrate and/or to protect the substrate support, which typically includes a clamping mechanism, from erosion by the plasma. The edge rings, sometimes called focus rings, can be sacrificial (e.g., consumable) parts. Conductive and non-conductive edge rings are described in commonly-assigned U.S. Pat. Nos. 5,805,408; 5,998,932; 6,013,984; 6,039,836 and 6,383,931.

SUMMARY

In accordance with an exemplary embodiment, an edge ring configured to surround an outer periphery of a substrate support in a plasma processing chamber wherein plasma is generated and used to process a substrate is disclosed, the substrate support comprising a base plate, a top plate, and an elastomer seal assembly between the base plate and the top plate, the substrate support having an upper vertical sidewall extending between an outer periphery of an upper surface of the top plate and an outer periphery of a lower surface of the top plate, a lower vertical sidewall extending between an outer periphery of an upper surface of the base plate and an outwardly extending annular support surface of the base plate, the edge ring comprising: an upper inner surface having an edge step directed towards an interior portion of the edge ring and arranged to extend from the outer periphery of the upper surface of the top plate to the outer periphery of the upper surface of the base plate; a lower inner surface; an outer surface; a lower surface extending from the lower inner surface to the outer surface; and a top surface extending from the outer surface to the upper inner surface.

In accordance with an exemplary embodiment, a lower electrode assembly configured to hold a substrate in a plasma processing chamber wherein plasma is generated and used to process the substrate is disclosed, the lower electrode assembly comprising: a substrate support includes a base plate, a top plate, and an elastomer seal assembly between the base plate and the top plate, the substrate support having an upper vertical sidewall extending between an outer periphery of an upper surface of the top plate to an outer periphery of a lower surface of the top plate, and a lower vertical sidewall extending between an outer periphery of an upper surface of the base plate and an outwardly extending annular support surface of the base plate; an edge ring, the edge ring including an upper inner surface having an edge step directed towards an interior portion of the edge ring and arranged to extend from the outer periphery of the upper surface of the top plate to the outer periphery of the upper surface of the base plate, a lower inner surface, an outer surface, a lower surface extending from the lower inner surface to the outer surface, and a top surface extending from the outer surface to the upper inner surface; and a support ring configured to be supported around the substrate support, and wherein the edge ring is at least partially supported above the support ring.

In accordance with an exemplary embodiment, the lower electrode assembly includes an elastomer seal configured to fit within an annular groove surrounding the elastomer seal assembly.

In accordance with an exemplary embodiment, a method of etching a semiconductor substrate in a plasma processing chamber having the lower electrode assembly as described herein is disclosed, which includes placing the semiconductor substrate on the upper surface of the top plate; and etching the semiconductor substrate in the plasma processing chamber.

In accordance with an exemplary embodiment, a lower electrode assembly configured to hold a substrate in a plasma processing chamber wherein plasma is generated and used to process the substrate is disclosed, the lower electrode assembly comprising: a substrate support includes a base plate, a top plate, and an elastomer seal assembly between the base plate and the top plate, the substrate support having an upper vertical sidewall extending between an outer periphery of an upper surface of the top plate to an outer periphery of a lower surface of the top plate, and a lower vertical sidewall extending between an outer periphery of an upper surface of the base plate and an outwardly extending annular support surface of the base plate; an edge ring, the edge ring including an upper inner surface directed towards an interior portion of the edge ring and arranged to extend from the outer periphery of the upper surface of the top plate to the outer periphery of the lower surface of the base plate, a lower inner surface, an upper lower surface extending from the upper inner surface to the lower inner surface, an outer surface, a lower surface extending from the lower inner surface to the outer surface, and a top surface extending from the outer surface to the upper inner surface; an inner edge step ring configured to be supported on at least a portion of the outwardly extending annular support surface of the base plate, the inner edge ring step including an upper inner surface having an edge step directed towards an interior portion of the inner edge step ring and arranged to extend from the outer periphery of the lower surface of the top plate to the outer periphery of the upper surface of the base plate, a lower inner surface, an outer surface, a lower surface extending from the lower inner surface to the outer surface, and a top surface extending from the outer surface to the upper inner surface; and a support ring configured to be supported around the substrate support, and wherein the edge ring is at least partially supported above the support ring.

DETAILED DESCRIPTION

Figure 1:
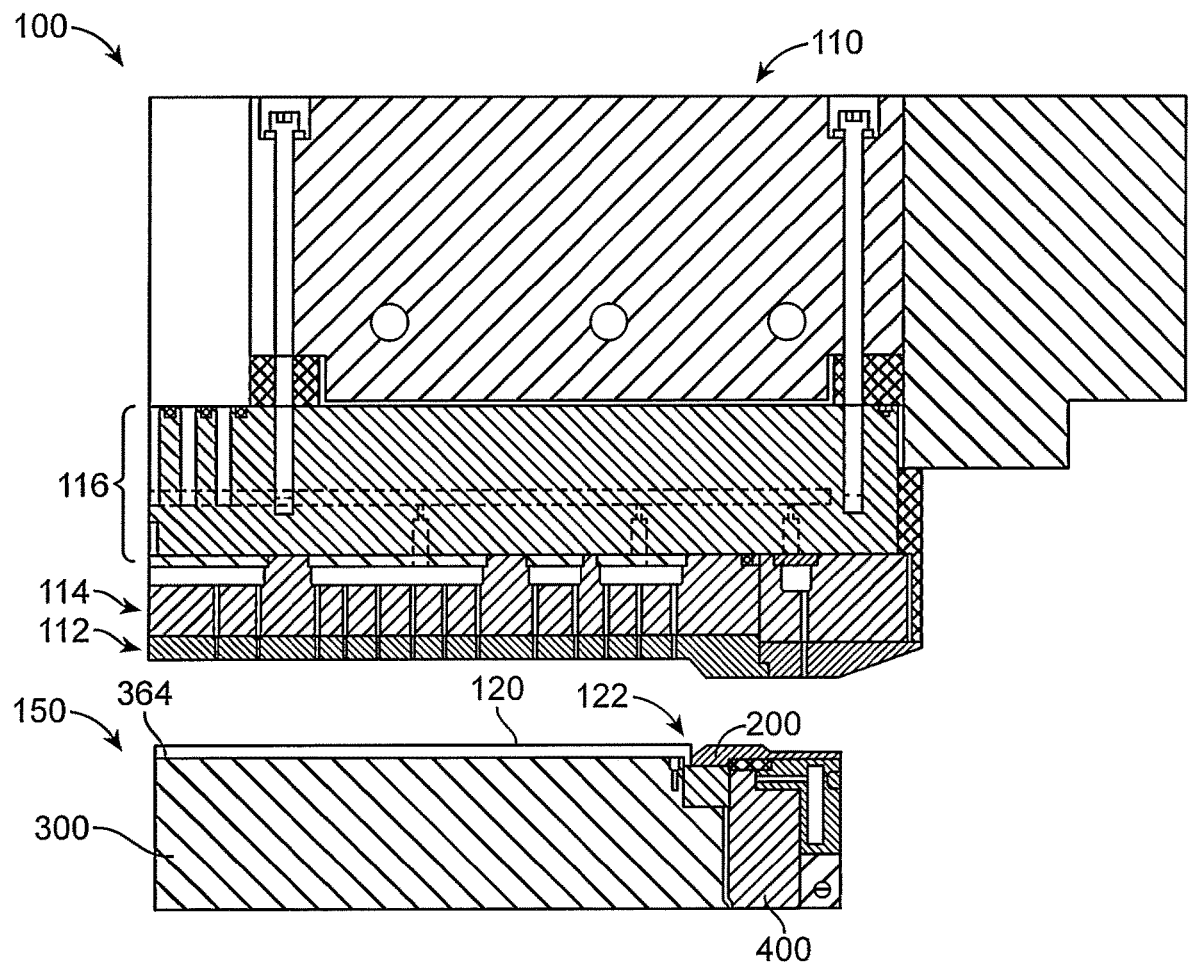
FIG. 1 illustrates a portion of an embodiment of a showerhead electrode assembly and a lower electrode assembly for a plasma processing apparatus wherein embodiments presented herein may be practiced.

As integrated circuit devices continue to shrink in their physical size and their operating voltages, their associated manufacturing yields become more susceptible to particle and metallic impurity contamination. Consequently, fabricating integrated circuit devices having smaller physical sizes requires that the level of particulate and metal contamination be less than previously considered to be acceptable.

The manufacturing of the integrated circuit devices includes the use of plasma processing chambers. A plasma processing chamber may be configured to etch selected layers of a semiconductor substrate. Such a processing chamber is configured to receive process gases while radio frequency (RF) power is applied to one or more electrodes in the processing chamber. The pressure inside the processing chamber is also controlled for the particular process. Upon applying the desired RF power to the electrode(s), the process gases in the chamber are energized such that a plasma is created. The plasma is thus generated to perform desired etching of selected layers of the semiconductor substrate.

One challenge facing designers of plasma processing chambers is that the plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. As a result, surface materials are removed by physical and/or chemical attack, including erosion, corrosion and/or corrosion-erosion. This attack causes problems including short part lifetimes, increased parts costs, particulate contamination, on-substrate transition metal contamination and process drift. Parts with relatively short lifetimes are commonly referred to as consumables. Short lifetimes of consumable parts increase the cost of ownership.

Another challenge is to control etch rate uniformity across a semiconductor substrate (e.g., silicon substrate), in particular, to make the etch rate at the center of the substrate equal to the etch rate at the edge. Therefore, substrate boundary conditions are preferably designed for achieving uniformity across the substrate in regard to parameters such as process gas composition, process gas pressure, substrate temperature, RF power, and plasma density.

Some plasma processing chambers are designed to have RF power applied to a powered electrode underlying an electrostatic clamping electrode, both of which are incorporated in a substrate support that supports a semiconductor substrate undergoing plasma processing. However, because the outer edge of the substrate may overhang the bottom electrode and/or the RF impedance path from the powered electrode through the electrostatic clamping electrode and substrate to the plasma can be different than the RF impedance path from an outer portion of the powered electrode to the plasma, a nonuniform plasma density can lead to non-uniform processing of the substrate.

To alleviate such non-uniformities, an edge ring and an underlying support ring, coupling ring and/or ground ring have been implemented fitting around the substrate support Improved plasma uniformity can be achieved by providing an RF impedance path which is similar at the center, and edge of a substrate undergoing plasma processing. The RF impedance path can be manipulated by choice of materials and/or dimensions of the support, coupling and/or ground ring. The support ring, coupling ring, and/or ground ring may be formed from a conductor, semiconductor, or dielectric material. In an embodiment the support ring, coupling ring, and/or ground ring may be formed from quartz or alumina.

Plasma chambers are generally used for etching layers of materials on substrates by supplying an etching gas comprising one or more gases to the chamber and applying energy to the etching gas to energize the gas into a plasma state. Various plasma chamber designs are known wherein radio frequency (RF) energy, microwave energy and/or magnetic fields can be used to produce and sustain medium density or high density plasma. In such plasma processing chambers process gas is supplied through a suitable arrangement such as a showerhead electrode or gas injection system and a semiconductor substrate supported on a lower electrode is plasma etched by plasma generated by supplying RF energy to the process gas.

For a metal etch process, the lower electrode assembly can be incorporated in a transformer coupled plasma (TCP™) reactor. Transformer coupled plasma reactors, wherein RF energy is inductively coupled into the reactor, are available from Lam Research Corporation, Fremont, Calif. An example of a high-flow plasma reactor that can provide high density plasma is disclosed in commonly-assigned U.S. Pat. No. 5,948,704, the disclosure of which is hereby incorporated by reference in its entirety.

FIG. 1 illustrates an exemplary embodiment of a showerhead electrode assembly 110 and a lower electrode assembly 150 for a plasma processing chamber 100 in which semiconductor substrates, for example, silicon substrates, are processed, wherein embodiments of the edge ring 200 discussed herein may be used. The showerhead electrode assembly 110 includes a top electrode 112, a backing member 114 secured to the top electrode 112, and a thermal control plate 116. Details of such arrangements can be found in commonly-assigned U.S. Pat. Nos. 7,854,820 and 7,862,682, incorporated herein by reference. The lower electrode assembly 150 including a substrate support 300 (only a portion of which is shown in FIG. 1) can include a bottom electrode (or base plate) 310 (FIG. 2) and an electrostatic clamping electrode (or top plate) 360, for example, an electrostatic chuck, which is positioned beneath the top electrode 112 in the plasma processing chamber 100. A substrate 120 subjected to plasma processing is electrostatically clamped on a substrate support surface 364 of the substrate support 300 (e.g., an electrostatic chuck).

In a capacitively coupled plasma processing chamber, a secondary ground may also be used in addition to the ground electrode. For example, the substrate support 300 can include a bottom electrode which is supplied RF energy at one or more frequencies and process gas can be supplied to the interior of the chamber through showerhead electrode 112 which is a grounded upper electrode. A secondary ground, located outwardly of the bottom electrode in the substrate support 300 can include an electrically grounded portion which extends generally in a plane containing the substrate 120 to be processed but separated from the substrate 120 by an edge ring 200. The edge ring 200 can be of electrically conductive or semi-conductive material which becomes heated during plasma generation. To reduce contamination of processed substrates, the edge ring 200 can be coated with a coating such as thermal sprayed yttria or aerosol deposited yttria.

For control of etch rate uniformity on substrate 120 and matching the etch rate at the center of the substrate 120 to the etch rate at the substrate edge 122, substrate boundary conditions are preferably designed for assuring continuity across the substrate in regard to the chemical exposure of the substrate edge 122, process pressure, and RF field strength. In order to minimize substrate contamination, the edge ring 200 is manufactured from a material compatible to the substrate itself. For example, the material of the edge ring 200 can be formed from quartz, silicon, silicon carbide, alumina and/or a composite of said materials.

Figure 2:
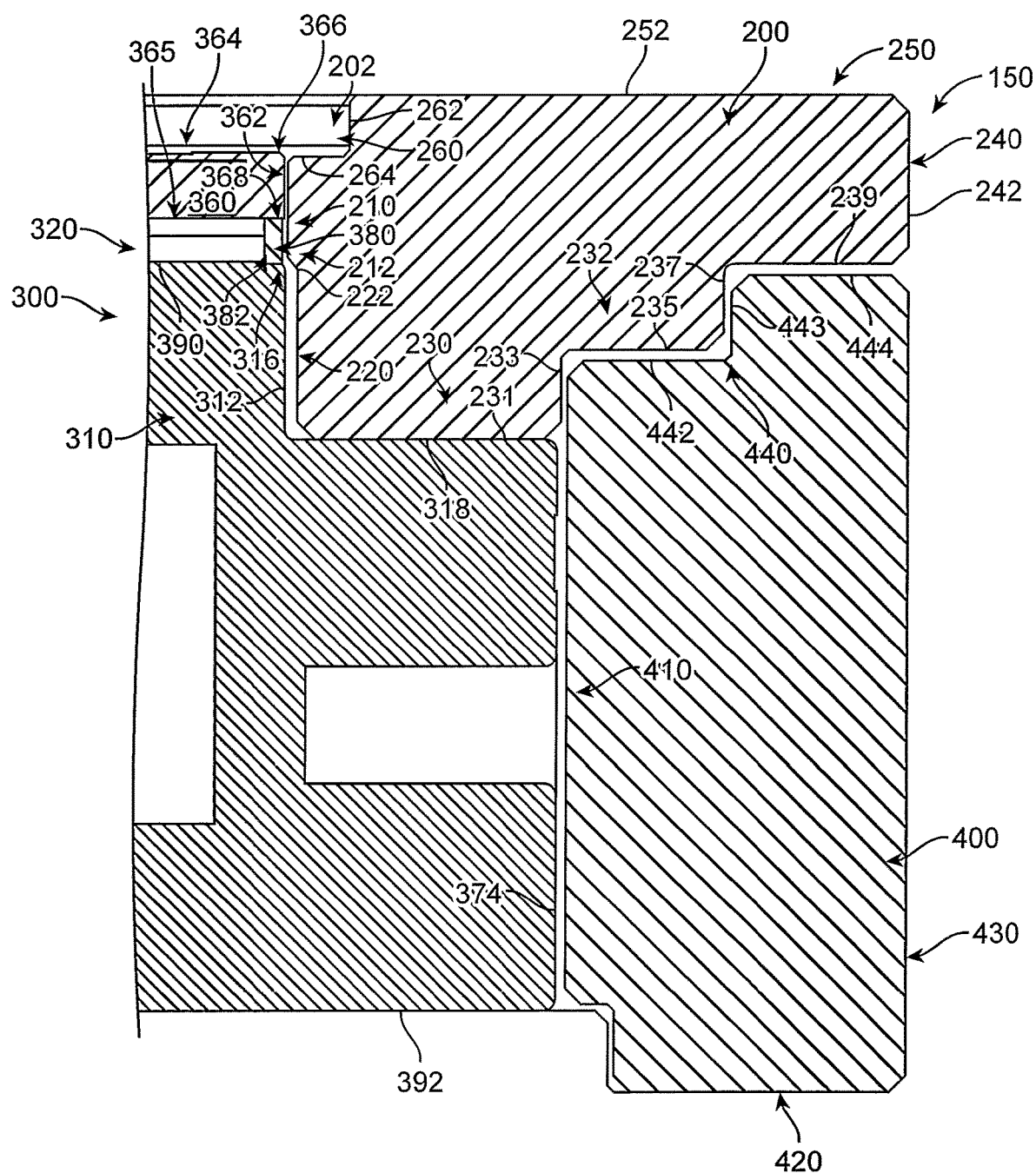
FIG. 2 is a cross-sectional view of a lower electrode assembly in accordance with an exemplary embodiment.

FIG. 2 is a cross-sectional view of the lower electrode assembly 150 in accordance with an exemplary embodiment. As shown in FIG. 2, the lower electrode assembly 150 includes an edge ring 200, a substrate support 300, and a support ring 400. The lower electrode assembly 150 is configured to hold a substrate 120 in a plasma processing chamber 110 wherein plasma is generated and used to process the substrate 120.

In accordance with an exemplary embodiment, the edge ring 200 includes an upper inner surface 210 having an edge step 212 directed towards an interior portion of the edge ring 200 and arranged to extend from an outer periphery 366 of the substrate support surface (or upper surface) 364 of the top plate 360 to an outer periphery 316 of an upper surface 390 of the base plate 310. In accordance with an exemplary embodiment, the edge step 212 extends around an outer periphery 325 (FIG. 3) of the elastomer seal assembly 320. The edge ring 200 also includes a lower inner surface 220, an outer surface 240, a lower surface 230 extending from the lower inner surface 220 to the outer surface 240, and a top surface 250 extending from the outer surface 240 to the upper inner surface 210. In accordance with an exemplary embodiment, the edge ring 200 has an inner angular surface 222 extending outward from the upper inner surface 210 to the lower inner surface 220. The inner angular surface 222 has a pair of edges 221, 223 (FIG. 4), which transition the upper inner surface 210 to the inner angular surface 222 and/or the inner angular surface 222 to the lower inner surface 220, respectively.

As shown in FIG. 2, the edge ring 200 also preferably includes an annular step 260 along the upper surface 250 on an upper inner portion 202 of the edge ring 200, which is configured to underlie an outer edge 122 of a substrate 120 (FIG. 1) positioned on the substrate support surface 364. In accordance with an exemplary embodiment, the lower surface 230 of the edge ring 200 can have one or more upwardly extending steps 232 along the lower inner surface 220. In accordance with an exemplary embodiment, the one or more upwardly extending steps 232 can be configured to be at least partially supported above the support ring 400 on a corresponding portion of support ring 400.

For example, in accordance with an exemplary embodiment, the one or more steps 232 comprises a first lower horizontal surface 231, a first vertical surface 233, a second lower horizontal surface 235, a second vertical surface 237, and a third horizontal surface 239. The first lower horizontal surface 231 extends outward to the first vertical surface 233. The first vertical surface 233 extends upward to the second lower horizontal surface 235. The second horizontal surface 235 extends outward to the second vertical surface 237. The second vertical surface 237 extends upward to the third horizontal surface 239. The third horizontal surface extends outward to the outer surface 240. In accordance with an exemplary embodiment, the first horizontal surface 231 is supported above the annular support surface 318 of the base plate 310. The second horizontal surface 235 and the third horizontal surface 239 are supported above a first horizontal surface 442 and second horizontal surface 444 on an upper surface 440 of the support ring 400. A first vertical surface 443 extends upward from the first horizontal surface 442 to the second horizontal surface 444. The first horizontal surface 442 extends radially outward from an inner surface 410 of the support ring 400. The second horizontal surface 444 extends outward to the outer surface 430 of the support ring 400. The support ring 400 also has a lower surface 420.

In accordance with an exemplary embodiment, the outer surface 240 of the edge ring 200 has a vertical outer wall 242. The top surface 250 preferably has a substantial flat or horizontal surface 252 extending inward to the annular step 260. The annular step 260 includes a vertical sidewall 262 and a horizontal surface 264. In accordance with an exemplary embodiment, the horizontal surface 264 extends inward to the upper inner surface 210. In accordance with an exemplary embodiment, each of the corners or transitions from one surface to an adjacent surface preferably has a rounded edge or surface thereto.

In accordance with an exemplary embodiment, the edge ring 200 is preferably circular in overall shape and is placed concentrically around the outer portion or periphery of the substrate support 300. In accordance with an exemplary embodiment, the edge ring 200 can be formed or at least partially fabricated from quartz. Alternatively, the edge ring 200 can be formed or at least partially fabricated from aluminum oxide ($Al_2O_3$, "alumina"), aluminum nitride, other type of ceramics, silicon, silicon carbide, silicon dioxide (e.g., crystalline or amorphous ($SiO_x$)), transitional metals such as solid yttrium, zirconia, ceria, and/or partially stabilized zirconia. The edge ring 200 can also have a protective outer coating (not shown). For example, the protective outer coating can be an yttrium oxide layer. In alternative embodiments, the outer coating can be comprised of SiC, Si, $SiO_2$, $ZrO_2$, or $Si_3N_4$.

Figure 3:
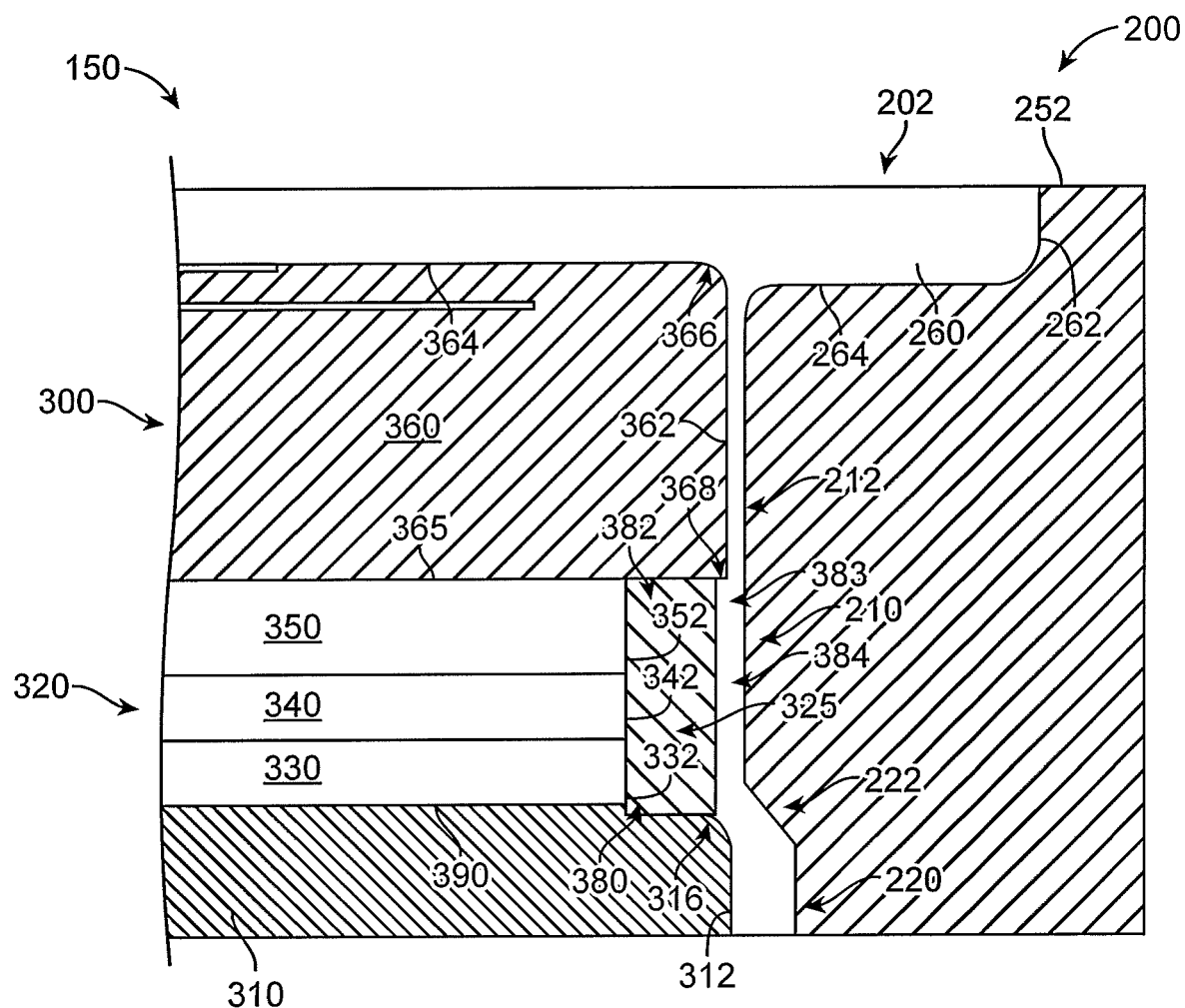
FIG. 3 is another cross-sectional view of the lower electrode assembly in accordance with an exemplary embodiment.

In accordance with an exemplary embodiment, the substrate support 300 can include an anodized aluminum base plate 310, a ceramic top pedestal or top plate 360, and an elastomer seal assembly 320 between the base plate 310 and the top plate 360. In accordance with an exemplary embodiment, the elastomer seal assembly 320 can include a lower (or first) bond layer 330, a heater and heater plate 340, and an upper (or second) bond layer 350 (FIG. 3). In accordance with an exemplary embodiment, the substrate support 300 can have an upper vertical sidewall 362 extending between an outer periphery 366 of top surface of the top plate 360 to an outer periphery 368 of a lower surface 365 of the top plate 360, and a lower vertical sidewall 312 extending between an outer periphery 316 of an upper surface 390 of the base plate 310 to an outwardly extending annular support surface 318 of the base plate 310.

In accordance with an exemplary embodiment, the lower bond layer 330, the heater and heater plate 340, and the upper bond layer 350 are recessed from a vertical sidewall 312 of the base plate 310 and/or a vertical sidewall (or outer surface) 362 of the top plate 360 forming an annular groove 380 around outer peripheries 332, 342, 352 of the lower bond layer 330, the heater and heater plate 340, and the upper bond layer 350, respectively. In accordance with an exemplary embodiment, an elastomer seal 382 in the form of an elastomeric band can be placed into the annular groove 380 surrounding the lower bond layer, the heater and heater plate 340 and the upper bond layer 350 to form a tight seal that prevents penetration of the corrosive gases of semi-conductor plasma processing reactors. For example, see commonly-assigned U.S. Pat. Nos. 7,884,925, 7,952,694, and 8,454,027, and U.S. Published Application No. 2013/0097840.

The lower bond layer 330 is typically comprised of a silicone layer impregnated with silica (e.g., amorphous $SiO_x$). In accordance with an embodiment, the heater plate 340 can be fabricated from aluminum. A ceramic-filled (e.g., alumina ($Al_2O_3$)) silicone material can be employed for the upper bond layer 350. The top plate 360 can be fabricated from materials, such as ceramics or polymers, which are commonly used to embed ESC electrodes, for example, doped ceramic materials such as alumina doped with titanium oxide or chromium oxide or doped boron nitride (BN), and/or sintered aluminum nitride (AlN). In accordance with an exemplary embodiment, the top plate 360 is configured to allow a substrate 120, such as a silicon wafer, to be securely held in place on the upper surface 364 of the top plate 360 for processing.

In accordance with an exemplary embodiment, the substrate support 300 may be configured to support the semiconductor substrate 120 on the substrate support surface 364. The substrate 120 may have an overhanging edge (or outer edge) 122 which extends beyond the upper vertical sidewall 362 of the substrate support 300 and into the annular step 260 within the upper inner portion 202 of the edge ring 200. In accordance with an exemplary embodiment, the edge ring 200 can be supported on the annular support surface 318 of substrate support 300 in combination with an upper surface 440 of the support ring 400. In an embodiment, the support ring 400 surrounds an outer surface 374 of the substrate support 300. In accordance with an exemplary embodiment, the support ring 400 is configured to be supported around the substrate support 300, and wherein the edge ring 200 is at least partially supported above the support ring 400.

The base plate 310 is preferably a circular plate having an upper surface 390 and lower surface 392. In one embodiment, the base plate 310 can be configured to provide temperature control by the inclusion of fluid channels (not shown) therein through which a temperature controlled liquid can be circulated to the electrode assembly 150. In the electrode assembly 150, the base plate 310 is typically a metal base plate which functions as the lower RF electrode in the plasma chamber. The base plate 310 preferably comprises an anodized aluminum or aluminum alloy. However, it can be appreciated that any suitable material, including metallic, ceramic, electrically conductive and dielectric materials can be used. In one embodiment, the base plate 310 is formed from an anodized machined aluminum block. Alternatively, the base plate 310 could be of ceramic material with one or more electrodes located therein and/or on an upper surface thereof.

FIG. 3 is another cross-sectional view of the lower electrode assembly 150 in accordance with an exemplary embodiment. As shown in FIGS. 2 and 3, outer peripheries of the base plate 310 and top plate 360 can extend beyond the outer peripheries 332, 342, 352 of the heater plate 340 and the bond layers 330, 350, thereby forming an annular groove 380 in the electrode assembly 150. The material(s) of bond layers 330, 350 are typically not resistant to the reactive etching chemistry of semi-conductor plasma processing reactors and should, therefore, be protected to accomplish a useful operation lifetime.

In accordance with an exemplary embodiment, the top plate 360 preferably is an electrostatic clamping layer of ceramic material and at least one embedded electrode comprised of a metallic material, such as W, Mo etc. In addition, the top plate 360 preferably has a uniform thickness from the center to the outer surface or periphery thereof 362. The top plate 360 is preferably a thin circular plate suitable for supporting 200 mm, 300 mm or 450 mm diameter wafers. Details of a lower electrode assembly 150 having a top plate 360 and an elastomer seal assembly 320 having one or more spatially distributed heaters, a first bond layer 330 attaching the base plate 310 to the heater plate 340 and a second bond layer 350 attaching the heater plate 340 to the top plate 360 are disclosed in commonly-assigned U.S. Pat. No. 8,038,796 wherein the top plate 360 has a thickness of about 0.04 inch, the upper bonding layer 350 has a thickness of about 0.004 inch, the heater plate 340 includes metal or ceramic plate of about 0.04 inch thickness and a heater film of about 0.01 inch thickness, and the lower bonding layer 330 has a thickness of about 0.013 to 0.04 inch.

In accordance with an exemplary embodiment, the annular groove 380 between the top plate 360 and the base plate 310 has a height of at least about 0.05 to 0.14 inches and a width of about 0.030 to about 0.060 inches. Ina preferred embodiment for processing 300 mm wafers, the annular groove 380 can have a height of at least about 0.07 inch and a width of about 0.035 inch.

In accordance with an exemplary embodiment, the elastomer seal 382 preferably has a generally rectangular cross-sectional profile, which is disposed in the annular groove 380. As disclosed in commonly-assigned U.S. Published Application No. 2013/0097840, the elastomer seal 382 can have a concave inner and/or outer surface to reduce bulging when the band is axially compressed in the groove 380. In accordance with an embodiment, the elastomer seal 382 can be constructed from any suitable semiconductor processing compatible material. For example, curable fluoroelastomeric fluoropolymers (FKM) capable of being cured to form a fluoroelastomer or curable perfluoroelastomeric perfluoropolymers (FFKM) can be used.

The heater plate 340 can comprise a laminate bonded to a lower surface of the top plate 360. For example, heater plate 340 can be in the form of a metal or ceramic plate with a film heater coupled to a bottom of the metal or ceramic plate. The heater film can be a foil laminate (not shown) comprising a first insulation layer (e.g., dielectric layer), a heating layer (e.g., one or more strips of electrically resistive material) and a second insulation layer (e.g., dielectric layer). The insulation layers preferably consist of materials having the ability to maintain its physical, electrical and mechanical properties over a wide temperature range including resistance to corrosive gases in a plasma environment such as Kapton or other suitable polyimide films. The heater element(s) preferably consists of a resistance heating alloy such as Inconel or other suitable alloy or anti-corrosion and resistive heating materials. For example, the film heater is in the form of a laminate of Kapton, Inconel and Kapton having a total thickness of about 0.005 to about 0.009 of an inch and more preferably about 0.007 of an inch thick.

As shown in FIG. 3, the edge step 212 of the upper inner surface 210 is directed towards an interior portion of the edge ring 200 and is arranged to extend from an outer periphery of the substrate support surface 364 of the top plate 360 to a lower surface 326 of an outer periphery of the elastomer seal assembly 320. In accordance with an exemplary embodiment, the edge step 212 reduces the size of a gap 384 between an outer periphery 383 of the elastomer seal 382 and the upper inner surface 210 of the edge ring 200. In addition, by reducing the size of the gap 384, the edge step 212 provides a constraint for the elastomer seal 382, when the elastomer seal 382 attempts to protrude outside of the annular groove 380. The reduction of the size of the critical gap 384 between the edge ring 200 and the elastomer seal 382 can also help prevent plasma erosion of the elastomer seal 382.

Figure 4:
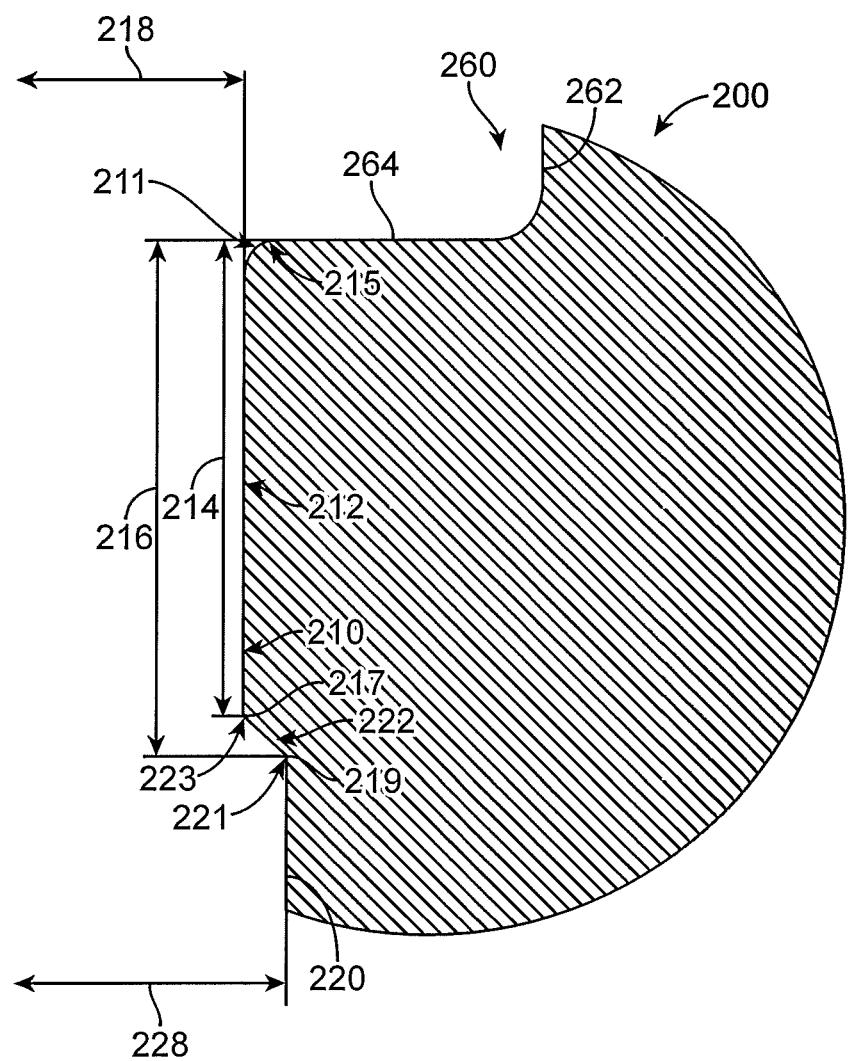
FIG. 4 is a cross-sectional view of a portion of an exemplary edge ring in accordance with an exemplary embodiment.

FIG. 4 is a cross-sectional view of a portion of an exemplary edge ring 200 in accordance with an exemplary embodiment. As shown in FIG. 4, the upper inner surface 210 of the edge ring 200 has a rounded edge 211 on an upper corner 215 of the upper inner surface 210. In accordance with an embodiment, the rounded edge 211 has a radius of about 0.010 inches. In accordance with an exemplary embodiment, the edge step 212 has a height 214 of about 0.160 inches to about 0.0170 inches, for example, 0.162 inches plus or minus about 0.004 inches, from the upper edge 215 of the upper inner surface 210 to a lower edge 217 of the upper inner surface 210. In accordance with an exemplary embodiment, the edge step 212 has a height 216 of about 0.170 inches to about 0.019 inches, for example, 0.0180 inches plus or minus 0.004 inches, from the upper edge 215 of the upper inner surface 210 to an upper edge 219 of the lower inner surface 220. In accordance with an embodiment, the upper edge 219 of the lower inner surface 220 can be rounded with a radius of about 0.006 inches to about 0.020 inches.

In accordance with an exemplary embodiment, the edge ring 200 has an inner diameter 218 of about 11.65 to 11.66 inches, for example, about 11.657 inches, to the upper inner surface 210, and an inner diameter 228 of about 11.68 to 11.69 inches, for example, about 11.686 inches, to the lower inner surface 220. In accordance with an exemplary embodiment, the edge step 212 extends from the lower inner surface 220 of the edge ring 200 radially inward about 0.014 to 0.15, for example, about 0.0145 inches.

Figure 5:
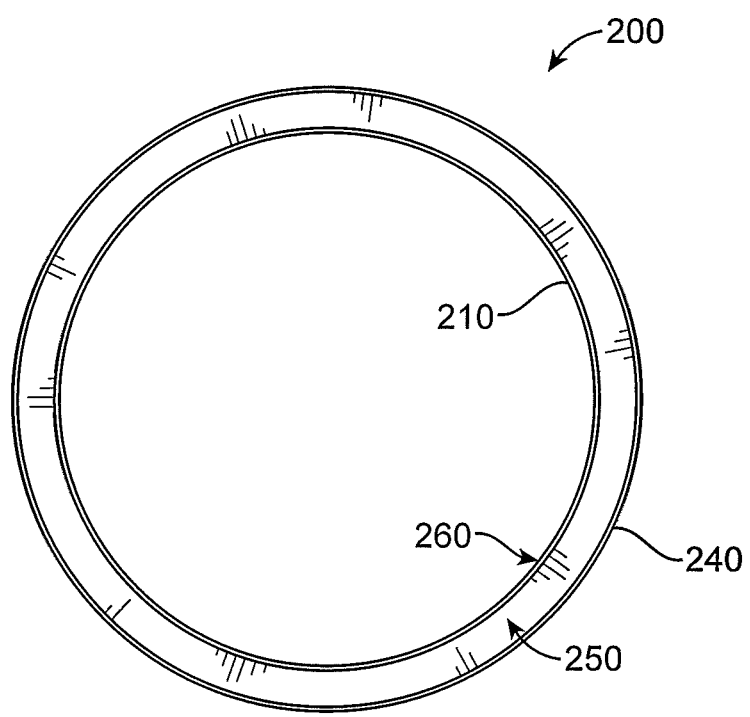
FIG. 5 is a top view of an exemplary edge ring in accordance with an exemplary embodiment.

FIG. 5 is a top view of an exemplary edge ring 200 in accordance with an exemplary embodiment. As shown in FIG. 5, the edge ring 200 is circular in overall shape and placed concentrically about the outer periphery of the substrate support 300. In use, the edge ring 200 surrounds the substrate support with the relatively flat top surface 250 being substantially horizontal and parallel to a substrate 120 placed on the substrate support 300.

Figure 6:
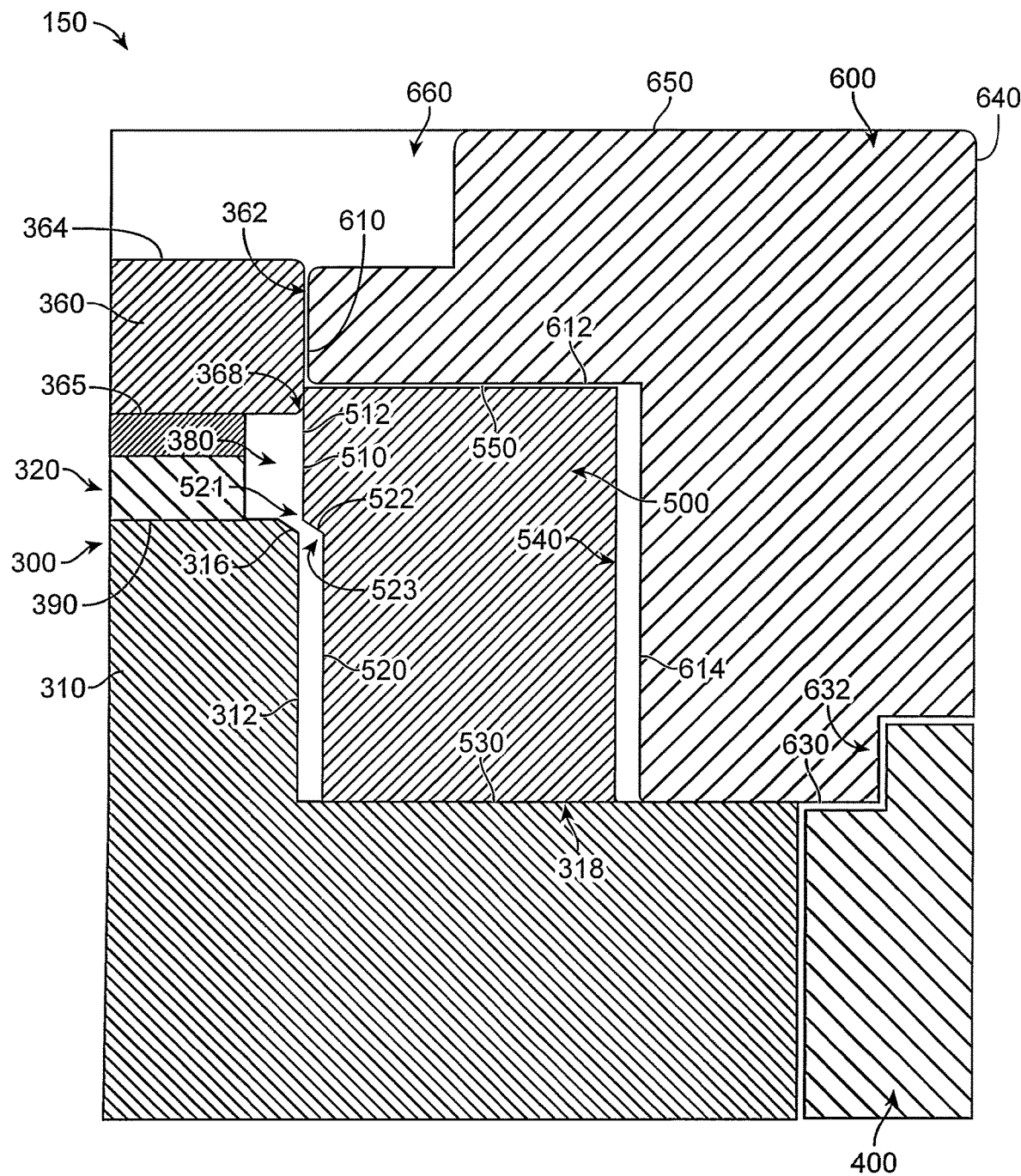
FIG. 6 is a cross-sectional view of a portion of a lower electrode assembly in accordance with an exemplary embodiment.

FIG. 6 is a cross-sectional view of a portion of a lower electrode assembly 150 in accordance with an exemplary embodiment. As shown in FIG. 6, the lower electrode assembly 150 includes a substrate support 300, a support ring 400, an inner edge step ring 500, and an edge ring 600. As shown in FIG. 6, the substrate support 300 can include an anodized aluminum base plate 310, a ceramic top pedestal or top plate 360, and an elastomer seal assembly 320 between the base plate 310 and the top plate 360. The elastomer seal assembly 320 can include a lower (or first) bond layer 330, a heater and heater plate 340, and an upper (or second) bond layer 350 as shown in FIG. 3. The substrate support 300 can have an upper vertical sidewall 362 extending between an outer periphery 366 of the top surface 364 of the top plate 360 to an outer periphery 368 of the lower surface 365 of the top plate 360, and a lower vertical sidewall 312 extending between an outer periphery 316 of the upper surface 390 of the base plate 310 to an outwardly extending annular support surface 318 of the base plate 310.

In accordance with an exemplary embodiment, the elastomer seal assembly 320 is recessed from a vertical sidewall 312 of the base plate 310 and/or an outer surface or vertical sidewall 362 of the top plate 360 forming an annular groove 380 around the outer periphery of the elastomer seal assembly 320. In accordance with an exemplary embodiment, the elastomer seal 382 (FIG. 2) in the form of an elastomeric band can be placed into the annular groove 380 surrounding the elastomer seal assembly 320 to form a tight seal that prevents penetration of the corrosive gases of semi-conductor plasma processing reactors.

The inner edge step ring 500 can be a circular ring having an upper inner surface 510, a lower inner surface 520, a lower surface 530, an outer surface 540 and an upper surface 550. The lower surface 530 preferably extends from a lower edge of the lower inner surface outward to a lower edge of the outer surface 540. The outer surface 540 extending upward to the upper surface 550. The upper surface 550 extends inward to an upper edge of the upper inner surface 510.

In accordance with an exemplary embodiment, the upper inner surface 510 preferably include an edge step 512. The edge step 512 of the upper inner surface 510 is directed towards an interior portion of the inner edge step ring 500 and is arranged to extend from an outer periphery 368 of a lower portion and/or the lower surface 365 of the top plate 360 to the outer periphery 316 of the upper surface 390 of the base plate 310. In accordance with accordance with an exemplary embodiment, the edge step 512 extend upward from the outer periphery 316 of the upper surface 390 of the base plate 310 to the outer periphery of the top plate 360. For example, as shown in FIG. 6, the edge step 512 can extend upward to the outer periphery 368 of the lower surface 365 of the top plate 360, or alternatively, the edge step 512 can extend upward to an outer periphery of the top plate 360 between the upper surface 364 and the lower surface 365.

In accordance with an exemplary embodiment, the edge step 512 reduces the size of a gap 384 (FIG. 3) between an outer periphery 383 of the elastomer seal 382 and the upper inner surface 510 of the inner edge step ring 500. In addition, by reducing the size of the gap 384, the edge step 512 provides a constraint for the elastomer seal 382, when the elastomer seal 382 attempts to protrude outside of the annular groove 380. The reduction of the size of the critical gap 384 between the edge ring 200 and the elastomer seal 382 can also help prevent plasma erosion of the elastomer seal 382.

In accordance with an exemplary embodiment, the inner edge step ring 500 has an inner angular surface 522, which extends outward from the upper inner surface 510 to the lower inner surface 520. The inner angular surface 522 can have a pair of edges 521, 523, which transition the upper inner surface 510 to the inner angular surface 522 and/or the inner angular surface 522 to the lower inner surface 520, respectively. The lower inner surface 520 extends downward to the lower surface 530. In accordance with an embodiment, the inner edge step ring 500 can have a generally rectangular cross-section. Alternatively, for example, the lower surface 530 can have one or more upwardly extending steps (not shown). For example, in accordance with an exemplary embodiment, the one or more upwardly extending steps can be configured to be at least partially supported above the support ring 400 on a corresponding portion of support ring 400.

In accordance with an exemplary embodiment, the inner edge step ring 500 can be made of a material that is not etched by plasmas containing halogen species, for example, F, Cl, and/or Br. For example, the inner edge step ring 500 can be made of anodized aluminum, alumina, aluminum and/or silicon carbide (SiC).

As shown in FIG. 6, the electrode assembly 150 can also include an edge ring 600 having an upper inner surface 610 directed towards an interior portion of the edge ring 600 and arranged to extend from an outer periphery 366 of the substrate support surface (or upper surface) 364 of the top plate 360 to an outer periphery 368 of a lower surface 365 of the top plate 360. In accordance with an exemplary embodiment, the edge ring 600 includes an upper lower surface 612 extending from the upper inner surface 610 to a lower inner surface 614. The edge ring 600 can also include an outer surface 640, a lower surface 630 extending from a lower inner surface 614 to the outer surface 640, and a top surface 650 extending from the outer surface 640 to the inner surface 610.

In accordance with an exemplary embodiment, the lower surface 630 can include one or more upwardly extending steps 632. The one or more upwardly extending steps 632 can be configured to be at least partially supported above the support ring 400 on a corresponding portion of support ring 400. As shown in FIG. 6, the edge ring 600 also preferably includes an annular step 660 along the upper surface 650 on an upper inner portion 602 of the edge ring 600, which is configured to underlie an outer edge 122 of a substrate 120 (FIG. 1) positioned on the substrate support surface 364.

When the word "about" is used in this specification in connection with a numerical value, it is intended that the associated numerical value include a tolerance of ±10% around the stated numerical value.

Moreover, when the words "generally", "relatively", and "substantially" are used in connection with geometric shapes, it is intended that precision of the geometric shape is not required but that latitude for the shape is within the scope of the disclosure. When used with geometric terms, the words "generally", "relatively", and "substantially" are intended to encompass not only features which meet the strict definitions but also features which fairly approximate the strict definitions.

It is to be understood that the form of this invention as shown is merely a preferred embodiment. Various changes may be made in the function and arrangement of parts; equivalent means may be substituted for those illustrated and described; and certain features may be used independently from others without departing from the spirit and scope of the invention as defined in the following claims.

What is claimed is:

1. An edge ring configured to surround an outer periphery of a substrate support in a plasma processing chamber, wherein plasma is generated and used to process a substrate, wherein the substrate support comprises a base plate, a top plate, and an elastomer seal assembly between the base plate and the top plate, wherein the substrate support has an upper vertical sidewall extending between an outer periphery of an upper surface of the top plate and an outer periphery of a lower surface of the top plate, and wherein a lower vertical sidewall extends between an outer periphery of an upper surface of the base plate and an outwardly extending annular support surface of the base plate, the edge ring comprising:
a lower inner surface;
an edge step angled to define an interior portion of the edge ring and comprising
an upper inner surface, and
an inner angular surface extending from the lower inner surface to the upper inner surface and at an angle to narrow a horizontal width of a gap between the elastomer seal assembly and the edge ring, such that the horizontal width decreases along the elastomer seal assembly between the inner angular surface and the elastomer seal assembly,
wherein the edge step is arranged to extend from a point outside of and opposing a periphery of the upper surface of the top plate down to a point outside and opposing the base plate, and
wherein the upper inner surface at least one of provides a constraint for an elastomer seal of the elastomer seal assembly or aids in preventing plasma erosion of the elastomer seal;
an outer surface;
a lower surface extending from the lower inner surface to the outer surface; and
a top surface extending from the outer surface to the upper inner surface.

2. The edge ring of claim 1, further comprising an annular step on an upper inner portion of the edge ring, wherein the annular step is configured to underlie an outer surface of the substrate positioned on a substrate support surface.

3. The edge ring of claim 2, wherein the top surface of the edge ring includes a horizontal surface extending outward from the annular step.

4. The edge ring of claim 2, wherein the upper inner surface is connected to a horizontal surface of the annular step by a rounded edge.

5. The edge ring of claim 1, wherein the lower surface has one or more upwardly extending steps.

6. The edge ring of claim 1, wherein the outer surface is a substantially vertical outer wall.

7. The edge ring of claim 1, wherein the edge step has a height of 0.16 to 0.17 inches and extends from the lower inner surface of the edge ring radially inward 0.014 to 0.015 inches.

8. The edge ring of claim 1, wherein the edge ring has an inner diameter of 11.65 to 11.66 inches to the upper inner surface and an inner diameter of 11.68 to 11.69 to the lower inner surface.

9. The edge ring of claim 1, wherein the edge ring is formed from quartz, silicon carbide, silicon, or alumina.

10. The edge ring of claim 1, wherein the edge ring is in contact with the base plate at a bottom surface of the edge ring.

11. The edge ring of claim 1, wherein the inner angular surface extends upward and radially from the lower inner surface to the upper inner surface to narrow the gap between the elastomer seal assembly and the edge ring to at least one of provide the constraint for the elastomer seal or prevent plasma erosion of the elastomer seal.

12. The edge ring of claim 1, wherein a gap between the top plate and the edge ring decreases from a lower portion of the top plate to an upper portion of the top plate.

13. The edge ring of claim 1, wherein a top surface of the top plate is higher than a surface extending horizontally from an upper end of the upper inner surface.

14. The edge ring of claim 1, wherein:
an angle between the upper inner surface and the inner angular surface is greater than 90°; and
an angle between the lower inner surface and the inner angular surface is greater than 90°.

15. The edge ring of claim 1, wherein the inner angular surface, by narrowing the gap, at least one of provides a constraint for the elastomer seal of the elastomer seal assembly or aids in preventing plasma erosion of the elastomer seal.

16. The edge ring of claim 1, wherein:
the inner angular surface, by narrowing the gap, provides a constraint on at least a portion of the elastomer seal; and
the upper inner surface provides a constraint on more surface area of the elastomer seal than the inner angular surface.

17. An electrode assembly comprising:
the edge ring of claim 1; and
the substrate support,
wherein the elastomer seal assembly comprises bond layers, a heater plate and the elastomer seal.

18. The electrode assembly of claim 17, wherein:
an annular groove exists between the top plate and the base plate and radially outward of the bond layers and the heater plate; and
the elastomer seal is disposed in the annular groove and is in contact with the top plate, the base plate, the bond layers and the heater plate.

19. A lower electrode assembly configured to hold a substrate in a plasma processing chamber, wherein plasma is generated and used to process the substrate, the lower electrode assembly comprising:
a substrate support comprising a base plate, a top plate, and an elastomer seal assembly between the base plate and the top plate, wherein the substrate support has an upper vertical sidewall extending between an outer periphery of an upper surface of the top plate to an outer periphery of a lower surface of the top plate, and wherein a lower vertical sidewall extends between an outer periphery of an upper surface of the base plate and an outwardly extending annular support surface of the base plate;
an edge ring including
a lower inner surface,
an edge step directed towards an interior portion of the edge ring and comprising
an upper inner surface, and
an inner angular surface extending from the lower inner surface to the upper inner surface and at an angle to narrow a horizontal width of a gap between the elastomer seal assembly and the edge ring, such that the horizontal width decreases along the elastomer seal assembly between the inner angular surface and the elastomer seal assembly,
wherein the edge step is arranged to extend from a point outside of and opposing a periphery of the upper surface of the top plate down to a point outside and opposing the base plate, and
wherein the upper inner surface at least one of provides a constraint for an elastomer seal of the elastomer seal assembly or aids in preventing plasma erosion of the elastomer seal,
an outer surface,
a lower surface extending from the lower inner surface to the outer surface, and
a top surface extending from the outer surface to the upper inner surface; and
a support ring configured to be supported around the substrate support, wherein the edge ring is at least partially supported above the support ring.

20. The lower electrode assembly of claim 19, wherein the edge ring has an annular step on an upper inner portion of the edge ring and is configured to underlie an outer surface of the substrate positioned on a substrate support surface.

21. The lower electrode assembly of claim 20, wherein the top surface of the edge ring includes a horizontal surface extending outward from the annular step.

22. The lower electrode assembly of claim 20, wherein the upper inner surface of the edge ring is connected to a radially extending surface of the annular step by a rounded edge.

23. The lower electrode assembly of claim 19, wherein the elastomer seal assembly comprises:
a heater plate comprising a metal or ceramic plate having one or more spatially distributed heaters;
a first bond layer attaching the base plate to the heater plate; and
a second bond layer attaching the heater plate to the top plate.

24. The lower electrode assembly of claim 19, wherein:
the lower surface has one or more upwardly extending steps; and
the one or more upwardly extending steps are configured to be supported on corresponding steps on an upper surface of the support ring.

25. The lower electrode assembly of claim 19, wherein the edge step of the edge ring has a height of 0.16 to 0.017 inches and extends from the lower inner surface of the edge ring radially inward 0.014 to 0.015 inches.

26. The lower electrode assembly of claim 19, wherein the edge ring has an inner diameter of 11.65 to 11.66 inches to the upper inner surface and an inner diameter of 11.68 to 11.69 inches to the lower inner surface.

27. The lower electrode assembly of claim 19, wherein the elastomer seal is configured to fit within an annular groove surrounding a heater plate of the elastomer seal assembly.

28. An edge ring configured to surround an outer periphery of a substrate support in a plasma processing chamber, wherein plasma is generated and used to process a substrate, wherein the substrate support comprises a base plate, a top plate, and an elastomer seal assembly between the base plate and the top plate, wherein the substrate support has an upper vertical sidewall extending between an outer periphery of an upper surface of the top plate and an outer periphery of a lower surface of the top plate, and wherein a lower vertical sidewall extends between an outer periphery of an upper surface of the base plate and an outwardly extending annular support surface of the base plate, the edge ring comprising:
a lower inner surface;
an edge step angled to define an interior portion of the edge ring and comprising
an upper inner surface, and
an inner angular surface extending from the lower inner surface to the upper inner surface and at an angle to narrow a horizontal width of a gap between the elastomer seal assembly and the edge ring, such that the horizontal width decreases along the elastomer seal assembly and between the inner angular surface and the elastomer seal assembly,
wherein the upper inner surface extends from a point outside of and opposing a periphery of the upper surface of the top plate down to a point outside of and opposing the periphery of the elastomer seal assembly, and
wherein the upper inner surface further narrows the horizontal width of the gap between the elastomer seal assembly and the edge ring, such that the horizontal width is smaller between the upper inner surface and the elastomer seal assembly than between the inner angular surface and the elastomer seal assembly;

an outer surface;

a lower surface extending from the lower inner surface to the outer surface; and a top surface extending from the outer surface to the upper inner surface, wherein the edge step extends from the lower inner surface of the edge ring radially inward 0.014 to 0.015 inches and has a height of 0.16 to 0.17 inches, an inner diameter of 11.65 to 11.66 inches to the upper inner surface, and an inner diameter of 11.68 to 11.69 to the lower inner surface, and wherein a height of a combination of the edge step and the inner angular surface is 0.17 to 0.19 inches.

29. The edge ring of claim 28, wherein at least one of the edge step or the inner angular surface, by narrowing the gap, provides a constraint for an elastomer seal of the elastomer seal assembly and aids in preventing plasma erosion of the elastomer seal assembly.

30. An edge ring configured to surround an outer periphery of a substrate support in a plasma processing chamber, wherein plasma is generated and used to process a substrate, wherein the substrate support comprises a base plate, a top plate, and an elastomer seal assembly between the base plate and the top plate, wherein the substrate support has an upper vertical sidewall extending between an outer periphery of an upper surface of the top plate and an outer periphery of a lower surface of the top plate, and wherein a lower vertical sidewall extends between an outer periphery of an upper surface of the base plate and an outwardly extending annular support surface of the base plate, the edge ring comprising:

a lower inner surface;

an edge step angled to define an interior portion of the edge ring and comprising an upper inner surface, and an inner angular surface extending from the lower inner surface to the upper inner surface and at an angle to narrow a horizontal width of a gap between the elastomer seal assembly and the edge ring, such that the horizontal width decreases along the elastomer seal assembly and between the inner angular surface and the elastomer seal assembly, wherein the upper inner surface extends from a point outside of and opposing a periphery of the top plate down to a point outside of and opposing the periphery of the elastomer seal assembly, wherein a maximum horizontal width of the gap between the upper inner surface and the elastomer seal assembly is not greater than a smallest horizontal width of the gap between the elastomer seal assembly and the inner angular surface, and wherein the edge step, by narrowing the gap, at least one of provides a constraint for an elastomer seal of the elastomer seal assembly or aids in preventing plasma erosion of the elastomer seal;

an outer surface;

a lower surface extending from the lower inner surface to the outer surface; and a top surface extending from the outer surface to the upper inner surface.

* * * * *